United States Patent
Park et al.

(10) Patent No.: US 10,635,204 B2
(45) Date of Patent: Apr. 28, 2020

(54) DEVICE FOR DISPLAYING USER INTERFACE BASED ON GRIP SENSOR AND STOP DISPLAYING USER INTERFACE ABSENT GRIPPING

(71) Applicant: SAMSUNG ELECTRONICS CO., LTD., Suwon-si, Gyeonggi-do (KR)

(72) Inventors: Soo Pyoung Park, Seoul (KR); Yong Jun Son, Hwaseong-si (KR); Jun Yoo, Suwon-si (KR); Kum Hyun Cho, Suwon-si (KR); Jae Il Joo, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 6 days.

(21) Appl. No.: 15/820,685

(22) Filed: Nov. 22, 2017

(65) Prior Publication Data

US 2018/0150150 A1 May 31, 2018

(30) Foreign Application Priority Data

Nov. 29, 2016 (KR) .................. 10-2016-0160450

(51) Int. Cl.
*G06F 3/041* (2006.01)
*G06F 3/0488* (2013.01)
*G06F 3/16* (2006.01)
*H03K 17/95* (2006.01)
*G06F 3/0487* (2013.01)

(52) U.S. Cl.
CPC ............ *G06F 3/041* (2013.01); *G06F 3/0488* (2013.01); *G06F 3/165* (2013.01); *H03K 17/952* (2013.01); *G06F 3/0487* (2013.01); *G06F 2203/04101* (2013.01); *G06F 2203/04108* (2013.01)

(58) Field of Classification Search
None
See application file for complete search history.

(56) References Cited

U.S. PATENT DOCUMENTS

| | | | |
|---|---|---|---|
| 6,130,489 | A | 10/2000 | Heimlicher |
| 8,493,342 | B2 | 7/2013 | Park et al. |
| 8,749,510 | B2 | 6/2014 | Park et al. |
| 8,838,085 | B2 | 9/2014 | Forutanpour et al. |
| 9,176,650 | B2 | 11/2015 | Park et al. |
| 9,473,611 | B2 | 10/2016 | Forutanpour et al. |
| 9,959,803 | B2 | 5/2018 | Kim et al. |
| 9,964,991 | B2 | 5/2018 | Kim |
| 2010/0085317 | A1 | 4/2010 | Park et al. |
| 2011/0096512 | A1 | 4/2011 | Klicpera et al. |

(Continued)

OTHER PUBLICATIONS

Extended Search Report dated Feb. 28, 2018 in counterpart European Patent Application No. 17203677.4.

*Primary Examiner* — David D Davis
(74) *Attorney, Agent, or Firm* — Nixon & Vanderhye P.C.

(57) ABSTRACT

Disclosed is an electronic device. The electronic device includes a sensor that senses at least one of whether the electronic device is gripped by a user or whether a hand of the user is close to a specific area of the electronic device, a display, and a processor that is electrically connected with the sensor and the display. If that the electronic device is gripped by the user is sensed and that the user's hand is close to the specific area is sensed, the processor displays a preset user interface in the display.

18 Claims, 17 Drawing Sheets

(56) References Cited

U.S. PATENT DOCUMENTS

| | | | |
|---|---|---|---|
| 2011/0148915 A1* | 6/2011 | Kim | G06F 1/1626 |
| | | | 345/619 |
| 2013/0002565 A1 | 1/2013 | Tumanov et al. | |
| 2013/0215060 A1* | 8/2013 | Nakamura | G06F 1/1626 |
| | | | 345/173 |
| 2013/0222338 A1* | 8/2013 | Gim | G06F 3/041 |
| | | | 345/174 |
| 2013/0285963 A1 | 10/2013 | Park et al. | |
| 2013/0288655 A1 | 10/2013 | Foruntanpour et al. | |
| 2014/0051482 A1* | 2/2014 | Makiguchi | G06F 3/0487 |
| | | | 455/566 |
| 2014/0125615 A1* | 5/2014 | Sato | G06F 3/0488 |
| | | | 345/173 |
| 2014/0204063 A1* | 7/2014 | Kaida | G06F 1/169 |
| | | | 345/184 |
| 2014/0289655 A1 | 9/2014 | Park et al. | |
| 2014/0357251 A1 | 12/2014 | Forutanpour et al. | |
| 2014/0375582 A1* | 12/2014 | Park | G06F 3/0414 |
| | | | 345/173 |
| 2015/0160699 A1* | 6/2015 | Choi | G06F 1/1643 |
| | | | 345/173 |
| 2015/0348459 A1 | 12/2015 | Kim et al. | |
| 2015/0355821 A1 | 12/2015 | Park et al. | |
| 2016/0070338 A1* | 3/2016 | Kim | G06F 3/0488 |
| | | | 345/173 |
| 2016/0076952 A1 | 3/2016 | Kim et al. | |
| 2016/0195986 A1 | 7/2016 | Kwon et al. | |
| 2016/0286118 A1* | 9/2016 | Cho | G06F 1/1694 |
| 2016/0310071 A1* | 10/2016 | Kim | A61B 5/4872 |
| 2016/0321442 A1* | 11/2016 | Song | G06F 3/0488 |
| 2017/0300205 A1* | 10/2017 | Villa | G06F 3/04817 |

* cited by examiner

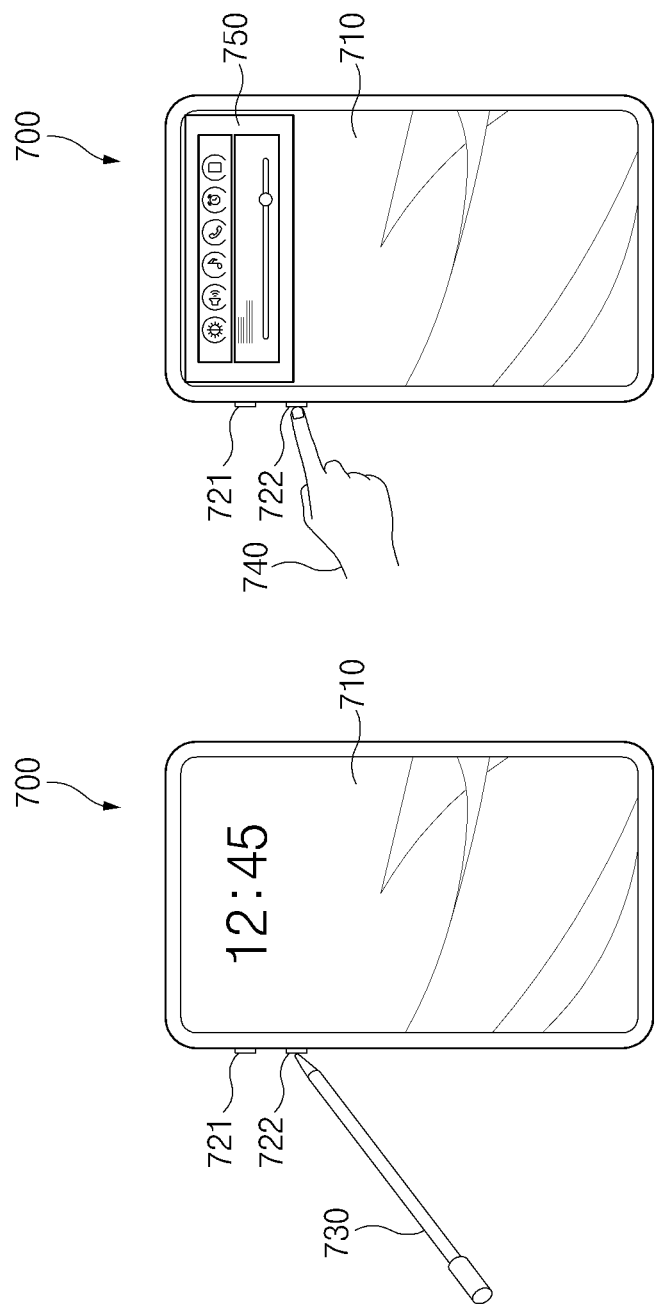

DEVICE FOR DISPLAYING USER INTERFACE BASED ON GRIP SENSOR AND STOP DISPLAYING USER INTERFACE ABSENT GRIPPING

CROSS-REFERENCE TO RELATED APPLICATION(S)

This application claims the benefit under 35 U.S.C. § 119(a) of a Korean patent application filed on Nov. 29, 2016 in the Korean Intellectual Property Office and assigned Serial number 10-2016-0160450, the entire disclosure of which is hereby incorporated by reference.

TECHNICAL FIELD

The present disclosure relates to a technology for displaying a user interface (UI) based on a sensing signal of a grip sensor.

BACKGROUND

An electronic device includes three keys (a home key, a back key, and a multi-key) for manipulation. The three keys may be on a lower portion of the electronic device in the form of a physical key or may be displayed in a display in the form of a soft key. Besides, each of various electronic devices using different operating systems includes a physical key in a lower end area of a front surface thereof for a device control.

SUMMARY

In the case where the size of an electronic device becomes smaller, the size of a display of the electronic device becomes smaller together. In this case, to dispose a physical key in an area such as a display area of the electronic device or to dispose a soft key to be always displayed therein reduces an effective area of the display.

Also, it is difficult to build various sensors in a small-sized electronic device.

In accordance with an aspect of the present disclosure, an electronic device may include a sensor that senses at least one of whether the electronic device is gripped by a user or whether a hand of the user is close to a specific area of the electronic device, a display, and a processor that is electrically connected with the sensor and the display. If that the electronic device is gripped by the user is sensed and that the user's hand is close to the specific area is sensed, the processor may display a preset user interface (UI) in the display.

In accordance with another aspect of the present disclosure, an electronic device may include an input module, a grip sensor that senses whether a hand of a user is close to the input module, a display, and a processor that is electrically connected with the grip sensor, the input module, and the display. If that the user's hand is close to the input module is sensed and the input module obtains an input, the processor may perform an operation corresponding to the input that the input module obtains.

In accordance with another aspect of the present disclosure, an electronic device may include a grip sensor that senses whether the electronic device is gripped by a user, a coupling detection sensor that senses whether an external device is coupled to the electronic device, a display, and a processor that is electrically connected with the grip sensor, the coupling detection sensor, and the display. The processor may display a screen in the display in a first mode if the external device is not coupled and the electronic device is not gripped, and may display a screen in the display in a screen mode that is determined based on whether the external device is coupled and the electronic device is gripped.

According to embodiments disclosed in this specification, an electronic device may control displaying a soft key by using a signal that a grip sensor senses, thereby making it possible to utilize a display area efficiently.

Also, the electronic device may determine whether an input to the electronic device is an input by a user's hand, thereby preventing an abnormal operation due to any other factor, not a user.

Also, the electronic device may use a pattern circuit of an antenna or a sensor coil of an inductive key together to allow the grip sensor to sense the user's hand, thereby making better use of a space in the electronic device.

Besides, a variety of effects directly or indirectly understood through this disclosure may be provided.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 7A is a view illustrating the case where a pen approaches the electronic device according to an embodiment of the present disclosure;

FIG. 7B is a view illustrating the case where a user's hand approaches the electronic device according to an embodiment of the present disclosure;

Throughout the drawings, it should be noted that like reference numbers are used to depict the same or similar elements, features, and structures.

DETAILED DESCRIPTION

Figure 1:
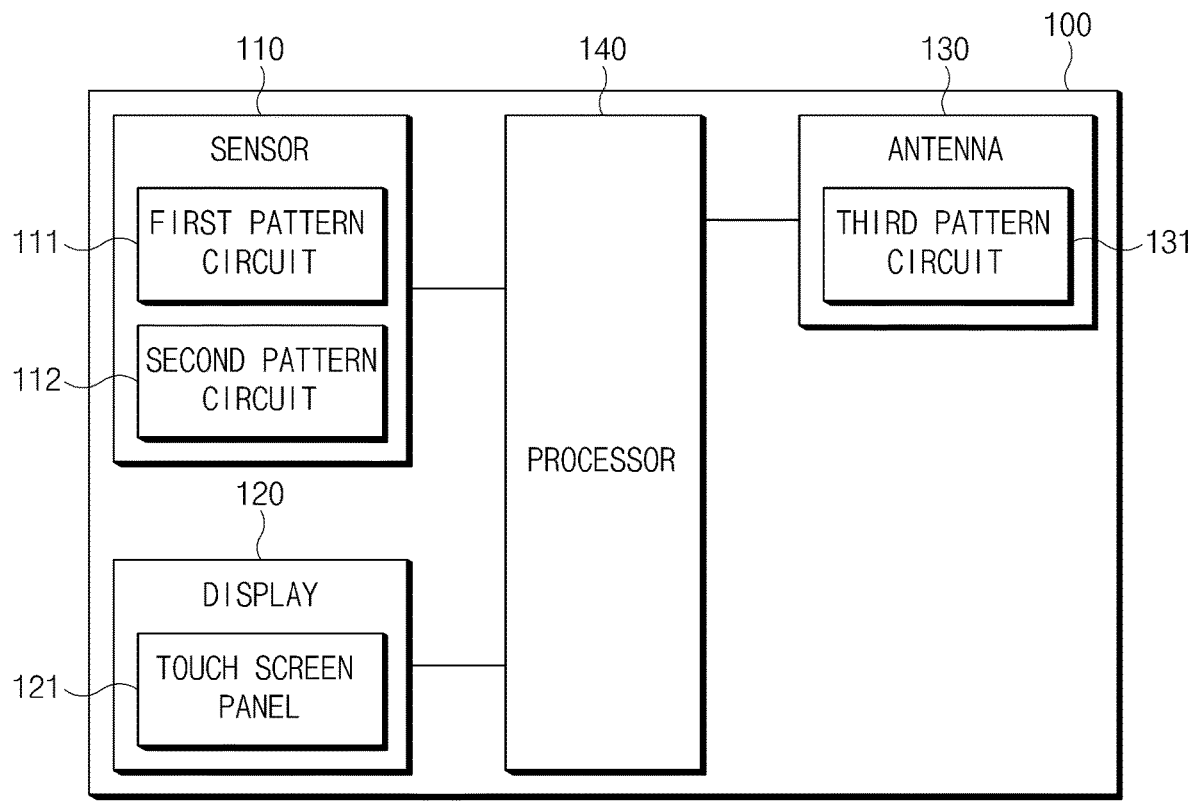
FIG. 1 is a block diagram of an electronic device according to an embodiment of the present disclosure.

Hereinafter, various embodiments of the present invention may be described with reference to accompanying drawings. Accordingly, those of ordinary skill in the art will recognize that modification, equivalent, and/or alternative on the various embodiments described herein can be variously made without departing from the scope and spirit of the present invention. With regard to description of drawings, similar elements may be marked by similar reference numerals.

In this disclosure, the expressions "have", "may have", "include" and "comprise", or "may include" and "may comprise" used herein indicate existence of corresponding features (e.g., elements such as numeric values, functions, operations, or components) but do not exclude presence of additional features.

In this disclosure, the expressions "A or B", "at least one of A or/and B", or "one or more of A or/and B", and the like may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used in this disclosure may be used to refer to various elements regardless of the order and/or the priority and to distinguish the relevant elements from other elements, but do not limit the elements. For example, "a first user device" and "a second user device" indicate different user devices regardless of the order or priority. For example, without departing the scope of the present disclosure, a first element may be referred to as a second element, and similarly, a second element may be referred to as a first element.

It will be understood that when an element (e.g., a first element) is referred to as being "(operatively or communicatively) coupled with/to" or "connected to" another element (e.g., a second element), it may be directly coupled with/to or connected to the other element or an intervening element (e.g., a third element) may be present. In contrast, when an element (e.g., a first element) is referred to as being "directly coupled with/to" or "directly connected to" another element (e.g., a second element), it should be understood that there are no intervening element (e.g., a third element).

According to the situation, the expression "configured to" used in this disclosure may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other components. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

Terms used in this disclosure are used to describe specified embodiments and are not intended to limit the scope of another embodiment. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of this disclosure. In some cases, even if terms are terms which are defined in this disclosure, they may not be interpreted to exclude embodiments of this disclosure.

An electronic device according to various embodiments of this disclosure may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices. According to various embodiments, the wearable device may include at least one of an accessory type (e.g., watches, rings, bracelets, anklets, necklaces, glasses, contact lens, or head-mounted-devices (HMDs), a fabric or garment-integrated type (e.g., an electronic apparel), a body-attached type (e.g., a skin pad or tattoos), or a bio-implantable type (e.g., an implantable circuit).

According to various embodiments, the electronic device may be a home appliance. The home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or PlayStation™), electronic dictionaries, electronic keys, camcorders, electronic picture frames, and the like.

According to another embodiment, an electronic device may include at least one of various medical devices (e.g., various portable medical measurement devices (e.g., a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, Global Navigation Satellite System (GNSS), event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller's machines (ATMs), points of sales (POSs) of stores, or internet of things (e.g., light bulbs, various sensors, electric or gas meters, sprinkler devices, fire alarms, thermostats, street lamps, toasters, exercise equipment, hot water tanks, heaters, boilers, and the like).

According to an embodiment, the electronic device may include at least one of parts of furniture or buildings/structures, electronic boards, electronic signature receiving devices, projectors, or various measuring instruments (e.g., water meters, electricity meters, gas meters, or wave meters, and the like). According to various embodiments, the electronic device may be one of the above-described devices or a combination thereof. An electronic device according to an embodiment may be a flexible electronic device. Furthermore, an electronic device according to an embodiment of this disclosure may not be limited to the above-described electronic devices and may include other electronic devices and new electronic devices according to the development of technologies.

Hereinafter, electronic devices according to various embodiments will be described with reference to the accompanying drawings. In this disclosure, the term "user" may refer to a person who uses an electronic device or may refer to a device (e.g., an artificial intelligence electronic device) that uses the electronic device.

First, an electronic device according to an embodiment of the present disclosure will be described with reference to FIGS. 1 to 5B.

FIG. 1 is a block diagram of an electronic device according to an embodiment of the present disclosure.

Referring to FIG. 1, an electronic device 100 according to an embodiment of the present disclosure may include a sensor 110, a display 120, an antenna 130, a processor 140, and the like. However, the elements illustrated in FIG. 1 are not essential. For example, the electronic device 100 may be implemented to include more elements or fewer elements.

The sensor 110 may sense at least one of whether the electronic device 100 is gripped by a user or whether a hand of the user is close to a specific area of the electronic device 100. The sensor 110 may sense at least one of whether the electronic device 100 is gripped or whether a hand of the user is close to the specific area, based on a change in a surrounding electromagnetic field.

For example, the sensor 110 may sense whether the electronic device 100 is gripped by a person or whether the electronic device 100 is in contact with an object, not a person. Also, the sensor 110 may sense whether a person's hand is close to the specific area of the electronic device 100 or whether an object, not a person, is close to the specific area of the electronic device 100. The sensor 110 may also sense whether an object close to the specific area is a person's finger(s).

The sensor 110 may include a first pattern circuit 111 for sensing whether the electronic device 100 is gripped by the user and a second pattern circuit 112 for sensing whether a user's hand is close to the specific area of the electronic device 100. The first pattern circuit 111 may be positioned on a side surface or at a lower end of the electronic device 100 for the purpose of sensing whether the electronic device 100 is gripped. The first pattern circuit 111 may determine, for example, whether the user grips the electronic device 100, based on a variation in a capacitor value corresponding to the first pattern circuit 111. The second pattern circuit 112 may be positioned in the specific area for sensing whether a user's hand is close to the electronic device 100. For example, in the case where the specific area that the sensor 110 senses is the lower end of the electronic device 100, the second pattern circuit 112 may be positioned at the lower end of the electronic device 100. The second pattern circuit 112 may determine whether a user's hand or the like is close to the electronic device 100, based on how much a pattern of an electromagnetic field formed around the second pattern circuit 112 is changed by the proximity of the user's hand or the like. In other words, the first pattern circuit 111 may operate as a sensor that senses whether an electronic device is gripped, and the second pattern circuit 112 may operate as a sensor that senses the proximity of the user to the electronic device 100.

The display 120 may display (output) information processed in the electronic device 100. For example, the display 120 may display a user interface (UI) or a graphic user interface (GUI) associated with an operating mode of the electronic device 100.

The display 120 may include a touch screen panel 121. For example, the display 120 may obtain a touch, gesture, proximity, or hovering input using an electronic pen or a part of a user's body. For example, in the case where the display 120 obtains a hovering input, the display 120 may obtain information about whether the hovering input is generated in any area.

The antenna 130 may radiate electromagnetic waves for communication of the electronic device 100. The antenna 130 may include a third pattern circuit 131 for radiating electromagnetic waves. The third pattern circuit 131 may be electrically connected with the above-described sensor 110, and the sensor 110 may sense at least one of whether the electronic device 100 is gripped by the user or whether a user's hand is close to the specific area of the electronic device 100, by using the third pattern circuit 131. In other words, at least one of the first pattern circuit 111 or the second pattern circuit 112 of the sensor 110 may be replaced with the third pattern circuit 131 of the antenna 130.

The processor 140 may be electrically connected with the sensor 110, the display 120, and the antenna 130 and may control overall operations of the electronic device 100. An operation of the processor 140 will be more fully described below.

Figure 2:
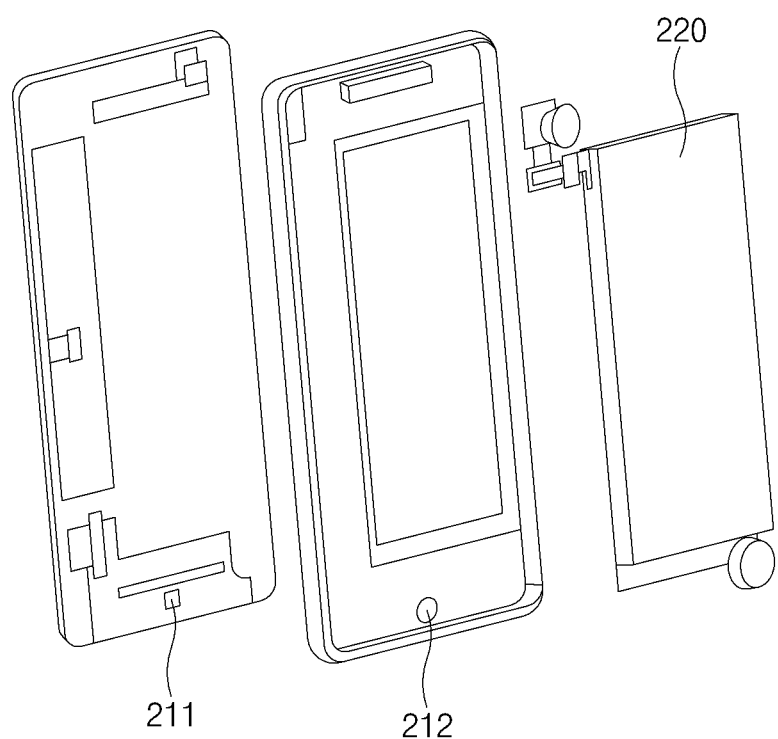
FIG. 2 is a view illustrating a configuration of a part of the electronic device according to an embodiment of the present disclosure.

FIG. 2 is a view illustrating a configuration of a part of an electronic device according to an embodiment of the present disclosure.

In FIG. 2, a first pattern circuit 211, a second pattern circuit 212, and a display 220 may correspond to the first pattern circuit 111, the second pattern circuit 112, and the display 120 of FIG. 1, respectively.

Referring to FIG. 2, the first pattern circuit 211 may be positioned in a lower end area of a display cover. The second pattern circuit 212 may be positioned in a specific area of a housing in which the display 220 is mounted. As illustrated in FIG. 2, in the case where the second pattern circuit 212 is positioned in the lower end area of the display 220, a sensor may sense whether a user's hand is close to the lower end area of the display 220.

Figures 3A, 3B:
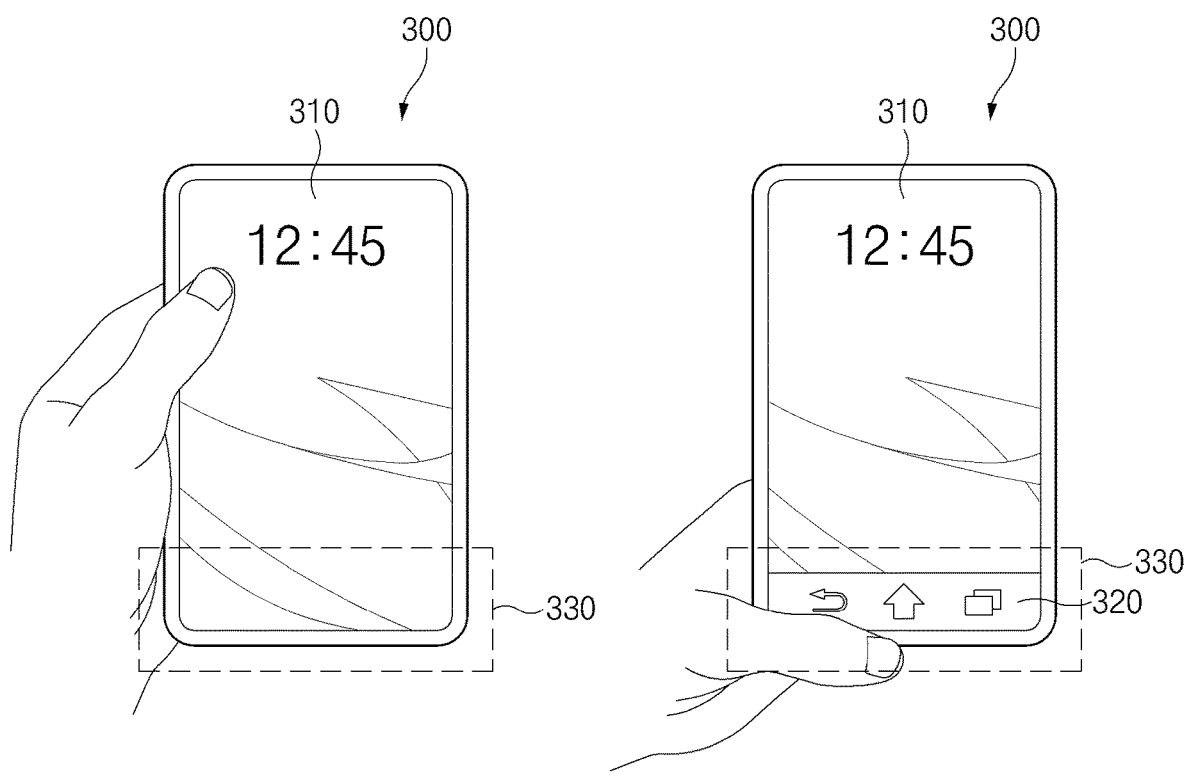
FIG. 3A is a view illustrating the case where a user's hand is not close to a specific area of a display according to an embodiment of the present disclosure.
FIG. 3B is a view illustrating the case where a user's hand is close to the specific area of the display according to an embodiment of the present disclosure.

FIG. 3A is a view illustrating the case where a user's hand is not close to a specific area of a display according to an embodiment of the present disclosure. FIG. 3B is a view illustrating the case where a user's hand is close to a specific area of a display according to an embodiment of the present disclosure.

In an embodiment of FIGS. 3A and 3B, a specific area that a sensor senses is a lower end area 330 of a display 310. In this embodiment, in the case where that an electronic device 300 is gripped by the user is sensed and that a user's hand is close to the lower end area 330, the processor 140 may display a 3-key UI 320 including a home key, a back key, and a multi-key in the display 310. Also, the processor 140 may display the 3-key UI 320 including a home key, a back key, and a menu-key in the display 310. However, the UI that the processor 140 displays is, but is not limited to, an example.

Referring to FIG. 3A, the electronic device 300 is gripped by the user, but a user's hand is not close to the lower end area 330 of the display 310. Since that the user's hand is not close to the lower end area 330 of the display 310 is sensed even though that the electronic device 300 is gripped by the user is sensed, the processor 140 does not display the 3-key UI 320 in the display 310 as illustrated in FIG. 3A.

Referring to FIG. 3B, the electronic device 300 is gripped by the user, and the user's hand is close to the lower end area 330 of the display 310. Since that the electronic device 300 is gripped by the user is sensed and that the user's hand is close to the lower end area 330 of the display 310 is sensed, the processor 140 displays the 3-key UI 320 in the display 310 as illustrated in FIG. 3B.

In the case where there is a change from the state where the user's hand is close to the lower end area 330 of the display 310 as illustrated in FIG. 3B to the state that the user's hand is not close to the lower end area 330 of the display 310 as illustrated in FIG. 3A, the processor 140 may not display the 3-key UI 320.

Figures 4A, 4B:
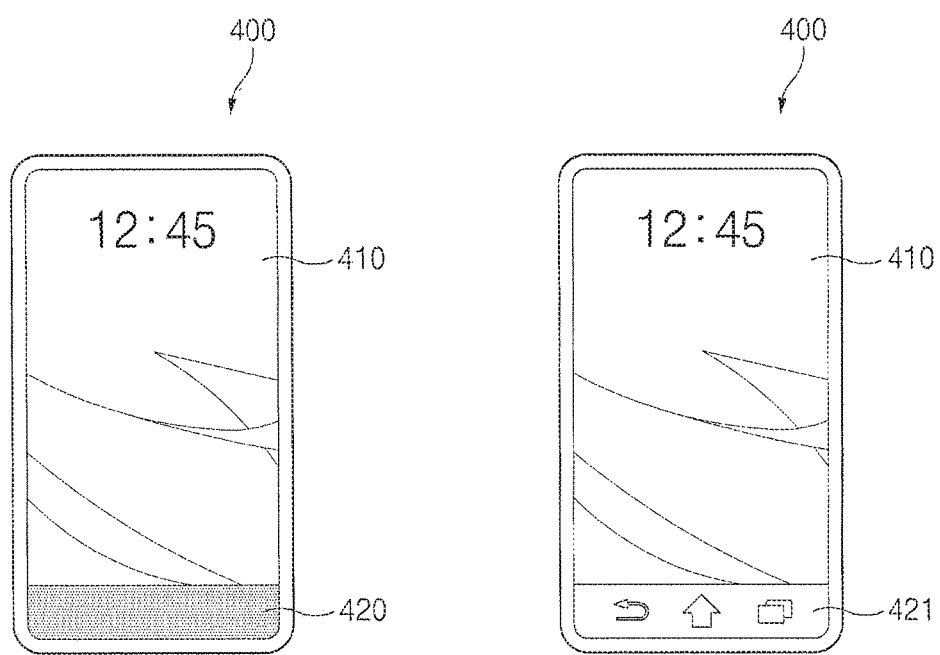
FIG. 4A is a view illustrating the case where a user interface (UI) is not displayed in a conventional electronic device.
FIG. 4B is a view illustrating the case where an UI is displayed in the conventional electronic device.

FIG. 4A is a view illustrating the case where an UI is not displayed in a conventional electronic device. FIG. 4B is a view illustrating the case where an UI is displayed in a conventional electronic device.

Figure 5A:
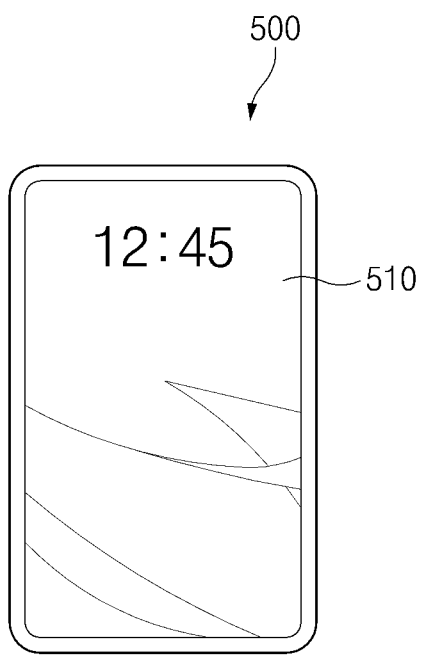
FIG. 5A is a view illustrating the case where an UI is not displayed in the electronic device according to an embodiment of the present disclosure.
Figure 5B:
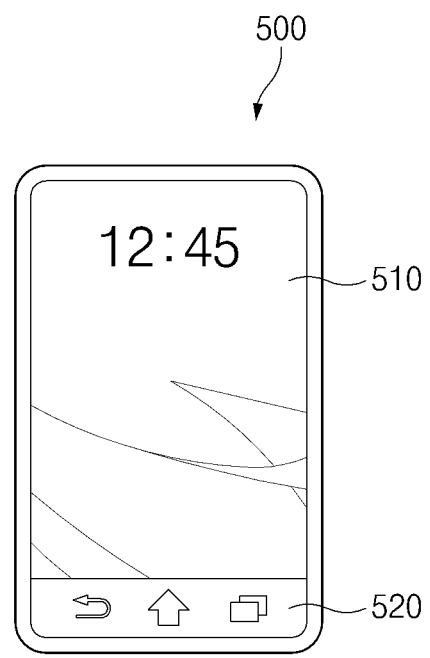
FIG. 5B is a view illustrating the case where an UI is displayed in the electronic device according to an embodiment of the present disclosure.

FIG. 5A is a view illustrating the case where an UI is not displayed in an electronic device according to an embodiment of the present disclosure. FIG. 5B is a view illustrating the case where an UI is displayed in an electronic device according to an embodiment of the present disclosure.

As illustrated in FIGS. 4A and 4B, a separate area 420 for displaying a conventional 3-key 421 is present in a display 410 of an electronic device that displays the 3-key 421 being a soft key. For example, in the case where the 3-key 421 is not displayed, as illustrated in FIG. 4A, the area 420 in which the 3-key 421 is displayed is represented in a black color. In the case where the 3-key 421 is displayed, as illustrated in FIG. 4B, the 3-key 421 is displayed in the area 420 that is represented in a black color as illustrated in FIG. 4A.

The processor 140 of the electronic device 500 according to an embodiment of the present disclosure may display a 3-key 520 on a screen that a display 510 displays. For example, even in the case where the 3-key 520 is not displayed, as illustrated in FIG. 5A, an area that is represented in a black color is absent from the display 510. As illustrated in FIG. 5B, in the case where the 3-key 520 is displayed, the 3-key 520 may be displayed on a screen that the display 510 displays.

If an UI is displayed as illustrated in FIGS. 5A and 5B, the user may utilize the entire screen even in the case where the 3-key 520 is not displayed.

Below, an electronic device according to an embodiment of the present disclosure will be described with reference to FIGS. 6 to 10.

Figure 6:
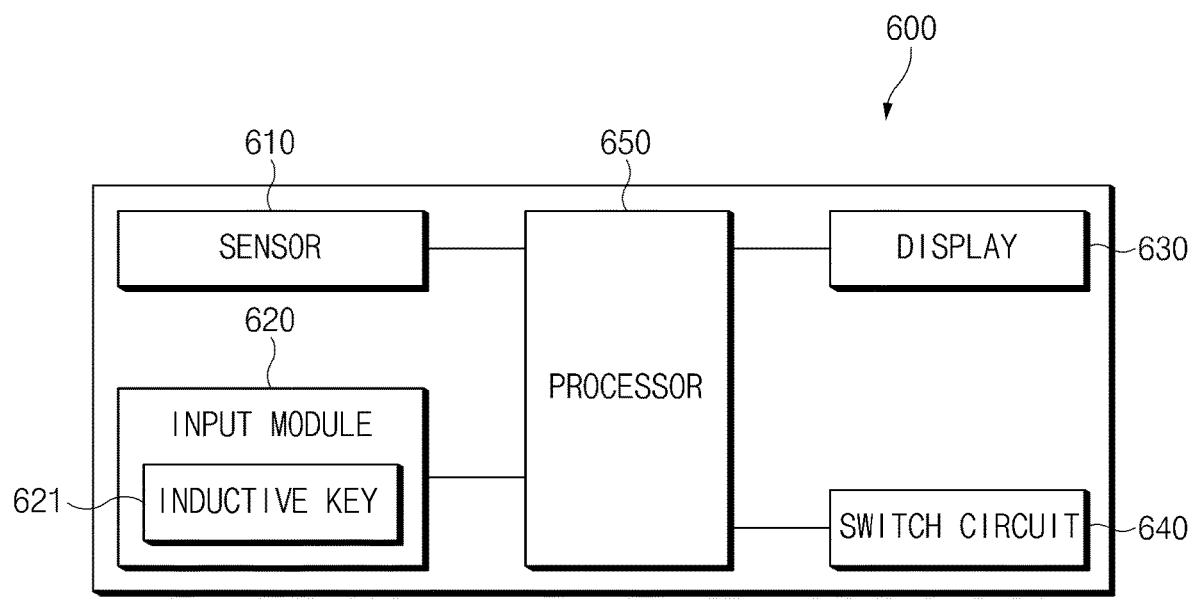
FIG. 6 is a block diagram of the electronic device according to an embodiment of the present disclosure.

FIG. 6 is a block diagram of an electronic device according to an embodiment of the present disclosure.

An embodiment of FIG. 6 may be implemented by further including an input module 620 in the electronic device 100 of FIG. 1.

Referring to FIG. 6, an electronic device 600 according to an embodiment of the present disclosure may include a sensor 610, an input module 620, a display 630, a switch circuit 640, a processor 650, and the like. However, the elements illustrated in FIG. 6 are not essential. For example, the electronic device 600 may be implemented to include more elements or fewer elements.

Like the sensor 110 of FIG. 1, the sensor 610 may sense at least one of whether the electronic device 600 is gripped by the user or whether a user's hand is close to a specific area of the electronic device 600. The sensor 610 may sense at least one of whether the electronic device 600 is gripped or whether the user's hand is close to the specific area, based on a change in a surrounding electromagnetic field.

The input module 620 may obtain an input from the user. The input module 620 may be an inductive key 621 that obtains an input based on an inductance change according to a press. The inductive key 621 will be more fully described below.

Like the display 120 of FIG. 1, the display 630 may display (output) information processed in the electronic device 600.

The switch circuit 640 may selectively connect a sensor coil and any one of a circuit of the inductive key 621 and a circuit of the sensor 610. An operation of the switch circuit 640 will be more fully described below.

The processor 650 may be electrically connected with the sensor 610, the input module 620, the display 630, and the switch circuit 640 and may control overall operations of the electronic device 600. In the case where that a user's hand is close to the input module 620 is sensed and the input module 620 obtains an input, the processor 650 may perform an operation corresponding to the input that the input module 620 obtains. However, although not described in detail below, the processor 650 may sense that the electronic device 600 is gripped by the user; even in the case where the input module 620 obtains an input, the processor 650 may perform an operation corresponding to the input obtained by the input module 620.

FIG. 7A is a view illustrating the case where a pen approaches an electronic device according to an embodiment of the present disclosure. FIG. 7B is a view illustrating the case where a user's hand approaches an electronic device according to an embodiment of the present disclosure. In this embodiment, an input module 721 and 722 may obtain an input for adjusting a volume of sound that an electronic device 700 outputs, and an operation corresponding to the input that the input module 721 and 722 obtains may be displaying of an UI representing a sound volume control and a sound volume level.

Referring to FIG. 7A, even though the input module 721 and 722 is pressed by a pen 730, the pen 730 is not a hand 740 of the user. Even though the input module 721 and 722 obtains an input, there is sensed that the user's hand 740 is not close to the input module 721 and 722. Accordingly, as illustrated in FIG. 7A, the processor 650 does not control a sound volume and does not display an UI 750 representing a sound volume level in a display 710.

Referring to FIG. 7B, the input module 721 and 722 is pressed by the user's hand 740. The input module 721 and 722 obtains an input, and that the user's hand 740 is close to the input module 721 and 722 is sensed. Therefore, the processor 650 may make a sound volume low as illustrated in FIG. 7B and may display the UI 750 representing a sound volume level in the display 710.

Below, an inductive key 800 will be described with reference to FIGS. 8A and 8B.

Figure 8A:
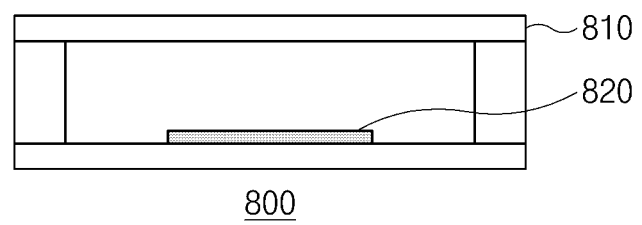
FIG. 8A is a view illustrating a structure of an inductive key according to an embodiment of the present disclosure.

FIG. 8A is a view illustrating a structure of an inductive key according to an embodiment of the present disclosure. FIG. 8B is a view illustrating a structure when an inductive key according to an embodiment of the present disclosure is pressed.

Figure 8B:
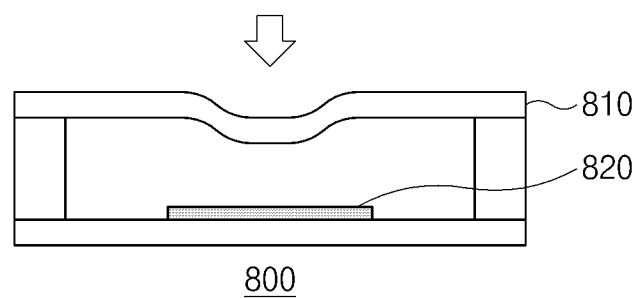
FIG. 8B is a view illustrating a structure when the inductive key according to an embodiment of the present disclosure is pushed.

Referring to FIGS. 8A and 8B, the inductive key 800 may obtain an input based on an inductance change according to a pressed. The inductive key 800 may include a metal button 810 and a sensor coil 820.

If the metal button 810 is pressed by the user, there is a change from a state illustrated in FIG. 8A to a state illustrated in FIG. 8B. As illustrated in FIGS. 8A and 8B, if the metal button 810 is pressed, a lower surface of the metal button 810 and the sensor coil 820 come up to each other, thereby causing a change in inductance. The inductive key 800 may generate an input signal based on the change in inductance. For example, the inductive key 800 may generate an input signal in the case where a change value of inductance is not less than a specific value.

Meanwhile, the sensor coil 820 of the inductive key 800 may be connected to the above-described sensor. The inductive key 800 may be used for the sensor to sense whether an electronic device is gripped and whether a user's hand is close to the electronic device.

Figure 9:
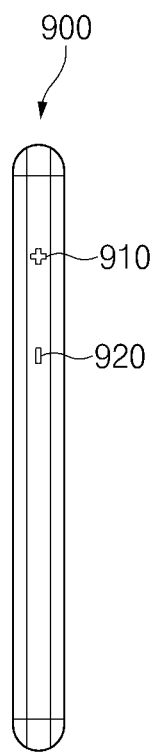
FIG. 9 is a view illustrating an electronic device in which an input module is positioned on a side surface thereof, according to an embodiment of the present disclosure.

FIG. 9 is a view illustrating an electronic device in which an input module is positioned on a side surface thereof, according to an embodiment of the present disclosure;

As illustrated in FIG. 9, an electronic device 900 may include two input modules 910 and 920, and each of the input modules 910 and 920 may obtain an input for controlling a volume of sound that the electronic device 900 outputs.

Below, an operation of a switch circuit will be more fully described with reference to FIG. 10.

Figure 10:
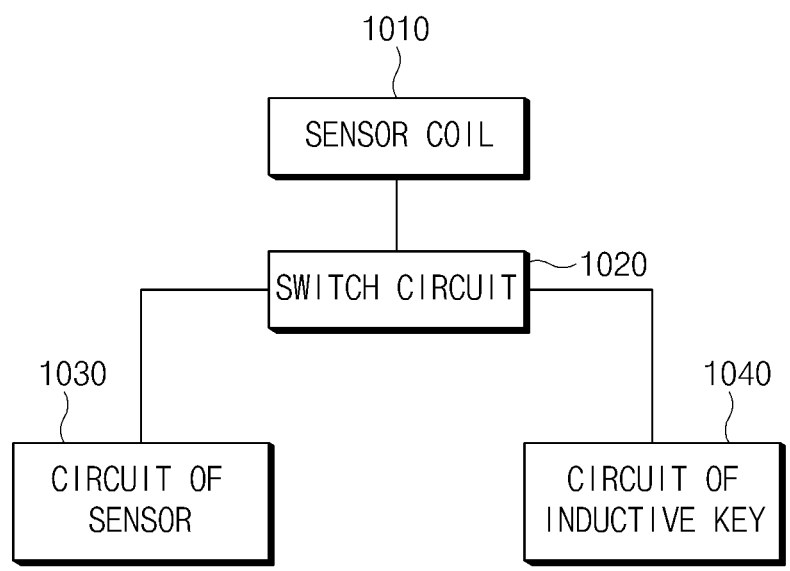
FIG. 10 is a block diagram illustrating a structure in which a sensor coil, a switch circuit, a grip sensor, and the inductive key are connected, according to an embodiment of the present disclosure.

FIG. 10 is a block diagram illustrating a structure in which a sensor coil, a switch circuit, a grip sensor, and an inductive key are connected, according to an embodiment of the present disclosure.

As illustrated in FIG. 10, a switch circuit 1020 may selectively connect a sensor coil 1010 and any one of a circuit 1040 of an inductive key and a circuit 1030 of a sensor.

In the case where the inductive key obtains an input in a state where the switch circuit 1020 connects the sensor coil 1010 and the circuit 1040 of the inductive key, the processor 650 may allow the switch circuit 1020 to connect the sensor coil 1010 and the circuit 1030 of the sensor.

Also, in the case where proximity of a user's hand to the input module is sensed by a sensor in a state where the switch circuit 1020 connects the sensor coil 1010 and the circuit 1030 of the sensor, the processor 650 may allow the switch circuit 1020 to connect the sensor coil 1010 and the circuit 1040 of the inductive key.

Below, an operation in which the processor 650 displays an UI when a user's hand is close to an input module according to an embodiment of the present disclosure will be described with reference to FIGS. 11A and 11B.

Figures 11A, 11B:
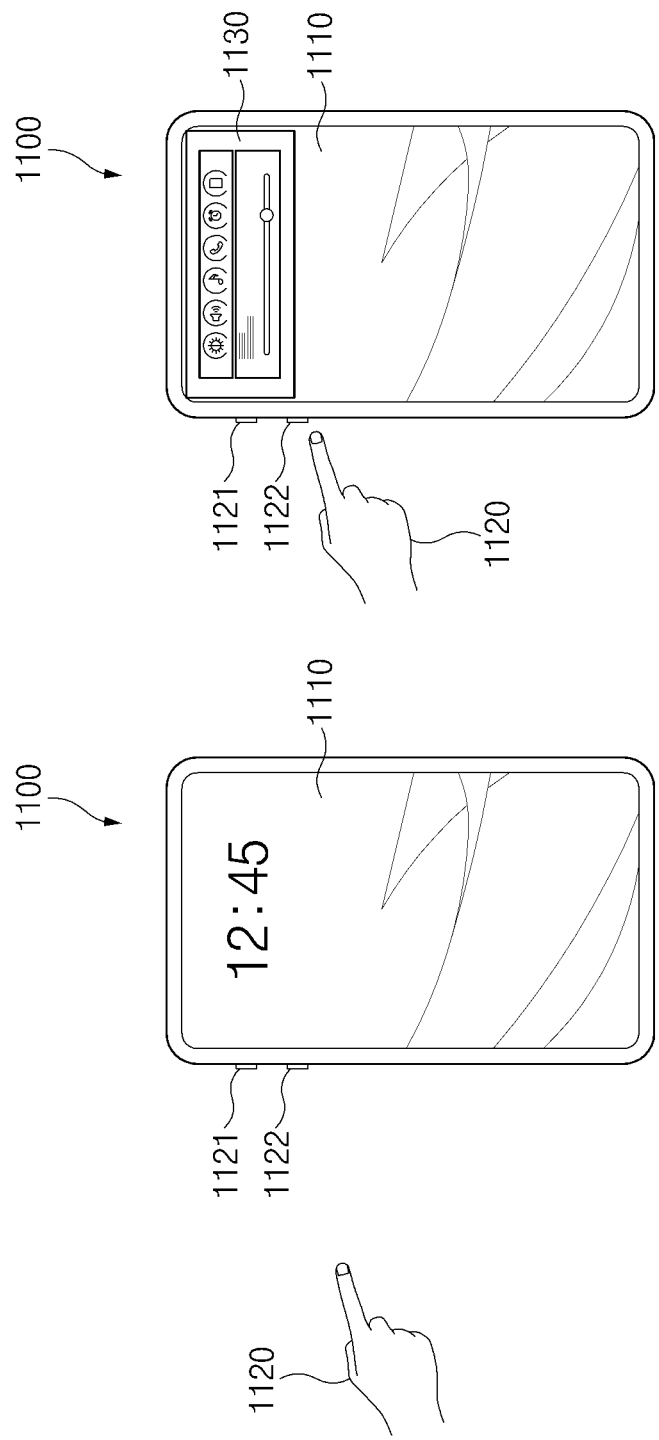
FIG. 11A is a view illustrating the case where a user's hand is not close to the input module according to an embodiment of the present disclosure.
FIG. 11B is a view illustrating the case where a user's hand is close to the input module according to an embodiment of the present disclosure.

FIG. 11A is a view illustrating the case where a user's hand is not close to an input module according to an embodiment of the present disclosure. FIG. 11B is a view illustrating the case where a user's hand is close to an input module according to an embodiment of the present disclosure. In this embodiment, an input module 1121 and 1122 may obtain an input for controlling a volume of sound that an electronic device 1100 outputs. An UI 1130 associated with an operation corresponding to the input may be displaying of the UI 1130 representing a sound volume control.

Referring to FIG. 11A, a hand 1120 of the user is not close to the input module 1121 and 1122. Since that the user's hand 1120 is not close to the input module 1121 and 1122 is sensed, as illustrated in FIG. 11A, the processor 650 may not display the UI 1130 representing a sound volume control in a display 1110.

Referring to FIG. 11B, the user's hand 1120 is close to the input module 1121 and 1122. Since proximity of the user's hand 1120 to the input module 1121 and 1122 is sensed, as illustrated in FIG. 11B, the processor 650 may display the UI 1130 representing a sound volume control in the display 1110.

Below, an electronic device according to an embodiment of the present disclosure will be described with reference to FIGS. 12 to 14B.

Figure 12:
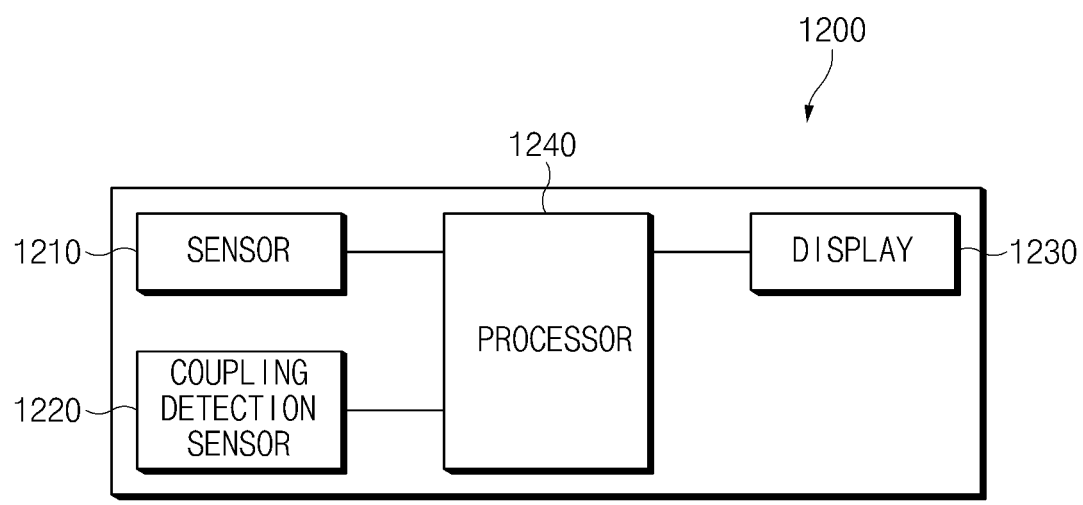
FIG. 12 is a block diagram of the electronic device according to an embodiment of the present disclosure.

FIG. 12 is a block diagram of an electronic device according to an embodiment of the present disclosure.

An embodiment of FIG. 12 may be implemented by further including a coupling detection sensor 1220 in the electronic device 100 of FIG. 1.

Referring to FIG. 12, an electronic device 1200 according to an embodiment of the present disclosure may include a sensor 1210, the coupling detection sensor 1220, a display 1230, a processor 1240, and the like. However, the elements illustrated in FIG. 12 are not essential. For example, the electronic device 1200 may be implemented to include more elements or fewer elements.

Like the sensor 110 of FIG. 1, the sensor 1210 may sense at least one of whether the electronic device 1200 is gripped by the user or whether a user's hand is close to a specific area of the electronic device 1200. The sensor 1210 may sense at least one of whether the electronic device 1200 is gripped or whether the user's hand is close to the specific area, based on a change in a surrounding electromagnetic field.

The coupling detection sensor 1220 may sense whether an external device is coupled to the electronic device 1200. For example, a necklace appcessory may be coupled to the electronic device 1200, and the coupling detection sensor 1220 may sense whether the necklace appcessory is coupled to the electronic device 1200.

Like the display 120 of FIG. 1, the display 120 may display (output) information processed in the electronic device 1200.

Figure 13A:
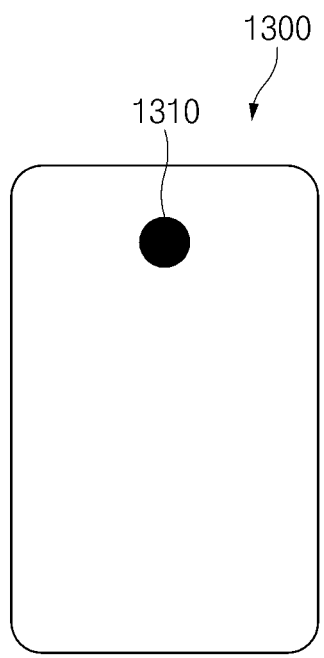
FIG. 13A is a view illustrating a rear surface of the electronic device according to an embodiment of the present disclosure.
Figure 13B:
FIG. 13B is a view illustrating a front surface of the electronic device according to an embodiment of the present disclosure.

FIG. 13A is a view illustrating a rear surface of an electronic device according to an embodiment of the present disclosure. FIG. 13B is a view illustrating a front surface of an electronic device according to an embodiment of the present disclosure.

As illustrated in FIG. 13A, an electronic device 1300 according to an embodiment of the present disclosure may include a coupling part 1310 to which a necklace appcessory is coupled. As illustrated in FIG. 13B, the electronic device 1300 may include a display 1320 on a front surface thereof.

The processor 1240 may be electrically connected with the sensor 1210, the coupling detection sensor 1220, and the display 1230 and may control overall operations of the electronic device 1200.

In the case where an external device is not coupled to the electronic device 1200 and the electronic device 1200 is not gripped, the processor 1240 may display a screen in the display 1230 in a first mode. The processor 1240 may display a screen in the display 1230 in a screen mode that is determined based on whether an external device is coupled and whether the electronic device 1200 is gripped.

Figure 14C:
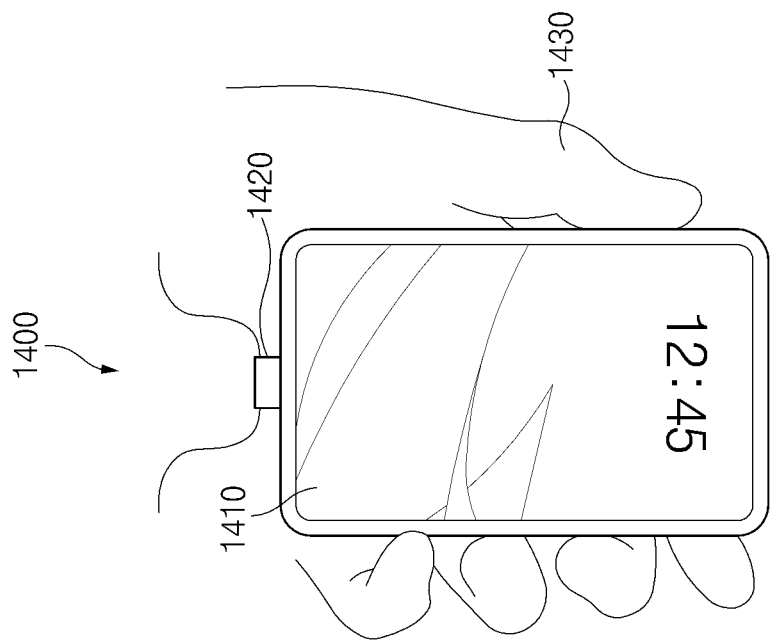
FIG. 14C is a view illustrating the case where the external device is coupled to the electronic device according to an embodiment of the present disclosure and the electronic device is gripped.
Figure 14B:
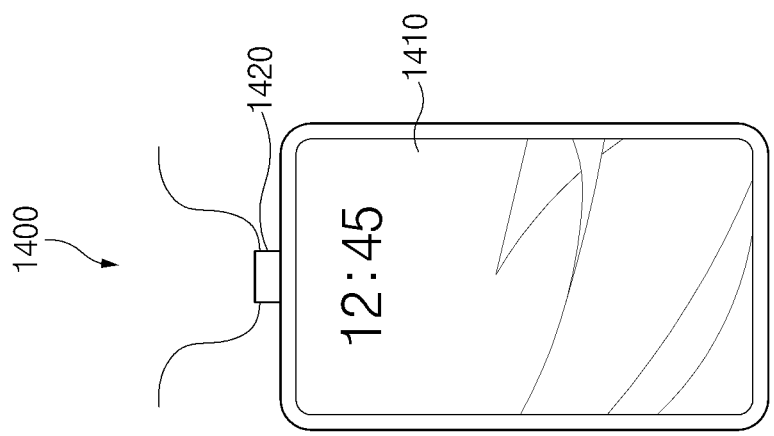
FIG. 14B is a view illustrating the case where the external device is coupled to the electronic device according to an embodiment of the present disclosure.
Figure 14A:
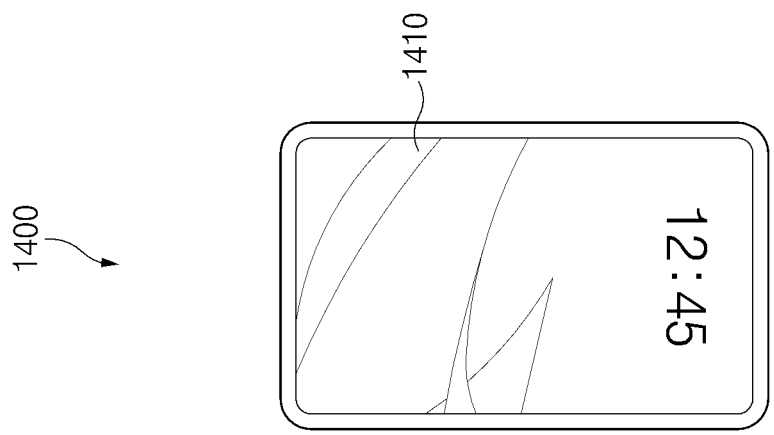
FIG. 14A is a view illustrating the case where an external device is not coupled to the electronic device according to an embodiment of the present disclosure and the electronic device is not gripped.

FIG. 14A is a view illustrating the case where an external device is not coupled to an electronic device according to an embodiment of the present disclosure and the electronic device is not gripped. FIG. 14B is a view illustrating the case where an external device is coupled to an electronic device according to an embodiment of the present disclosure. FIG. 14C is a view illustrating the case where an external device is coupled to an electronic device according to an embodiment of the present disclosure and the electronic device is gripped. In this embodiment, a screen mode displayed in a direction illustrated in FIGS. 14A and 14C is a first mode, and a screen mode displayed in a direction illustrated in FIG. 14B is a second mode.

Referring to FIG. 14A, a necklace appcessory 1420 is not coupled to an electronic device 1400, and the electronic device 1400 is not gripped by the user. Since an external device is not coupled to the electronic device 1400 and that the electronic device 1400 is not gripped is sensed, the processor 1240 may display a screen in a display 1410 in the first mode.

Referring to FIG. 14B, the necklace appcessory 1420 is coupled to the electronic device 1400, and the electronic device 1400 is not gripped by the user. Since an external device is coupled to the electronic device 1400 and that the electronic device 1400 is not gripped is sensed, the processor 1240 may determine a screen mode as the second mode being a mode in which a screen of the first mode is turned 180 degrees and may display a screen in the display 1410 in the second mode determined.

Referring to FIG. 14C, the necklace appcessory 1420 is coupled to the electronic device 1400, and the electronic device 1400 is gripped by the user. Since an external device is coupled to the electronic device 1400 and that the electronic device 1400 is gripped is sensed, the processor 1240 may determine a screen mode as the first mode and may display a screen in the display 1410 in the first mode determined.

Figure 15:
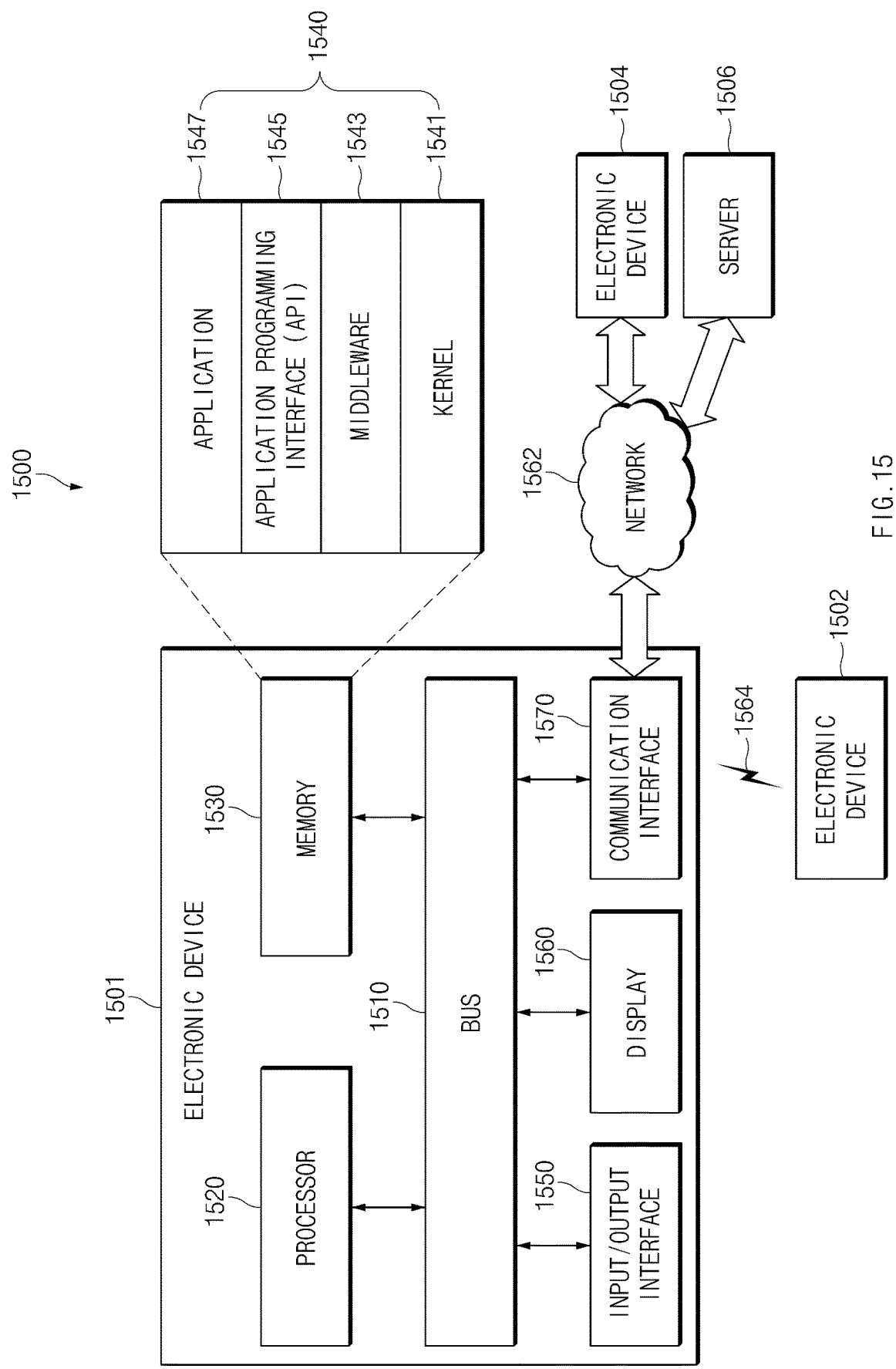
FIG. 15 illustrates the electronic device in a network environment according to various embodiments.

FIG. 15 illustrates an electronic device in a network environment, according to various embodiments.

Referring to FIG. 15, according to various embodiments, an electronic device 1501, a first electronic device 1502, a second electronic device 1504, or a server 1506 may be connected with each other over a network 1562 or local wireless communication 1564. The electronic device 1501 may include a bus 1510, a processor 1520, a memory 1530, an input/output interface 1550, a display 1560, and a communication interface 1570. According to an embodiment, the electronic device 1501 may not include at least one of the above-described elements or may further include other element(s).

For example, the bus 1510 may interconnect the above-described elements 1510 to 1570 and may include a circuit for conveying communications (e.g., a control message and/or data) among the above-described elements.

The processor 1520 may include one or more of a central processing unit (CPU), an application processor (AP), or a communication processor (CP). For example, the processor 1520 may perform an arithmetic operation or data processing associated with control and/or communication of at least other elements of the electronic device 1501.

The memory 1530 may include a volatile and/or nonvolatile memory. For example, the memory 1530 may store instructions or data associated with at least one other element(s) of the electronic device 1501. According to an embodiment, the memory 1530 may store software and/or a program 1540. The program 1540 may include, for example, a kernel 1541, a middleware 1543, an application programming interface (API) 1545, and/or an application program (or "an application") 1547. At least a part of the kernel 1541, the middleware 1543, or the API 1545 may be referred to as an "operating system (OS)".

For example, the kernel 1541 may control or manage system resources (e.g., the bus 1510, the processor 1520, the memory 1530, and the like) that are used to execute operations or functions of other programs (e.g., the middleware 1543, the API 1545, and the application program 1547). Furthermore, the kernel 1541 may provide an interface that allows the middleware 1543, the API 1545, or the application program 1547 to access discrete elements of the electronic device 1501 so as to control or manage system resources.

The middleware 1543 may perform, for example, a mediation role such that the API 1545 or the application program 1547 communicates with the kernel 1541 to exchange data.

Furthermore, the middleware 1543 may process one or more task requests received from the application program 1547 according to a priority. For example, the middleware 1543 may assign the priority, which makes it possible to use a system resource (e.g., the bus 1510, the processor 1520, the memory 1530, or the like) of the electronic device 1501, to at least one of the application program 1547. For example, the middleware 1543 may process the one or more task requests according to the priority assigned to the at least one, which makes it possible to perform scheduling or load balancing on the one or more task requests.

The API 1545 may be, for example, an interface through which the application program 1547 controls a function provided by the kernel 1541 or the middleware 1543, and may include, for example, at least one interface or function (e.g., an instruction) for a file control, a window control, image processing, a character control, or the like.

The input/output interface 1550 may play a role, for example, an interface which transmits an instruction or data input from a user or another external device, to other element(s) of the electronic device 1501. Furthermore, the input/output interface 1550 may output an instruction or data, received from other element(s) of the electronic device 1501, to a user or another external device.

The display 1560 may include, for example, a liquid crystal display (LCD), a light-emitting diode (LED) display, an organic LED (OLED) display, a microelectromechanical systems (MEMS) display, or an electronic paper display. The display 1560 may display, for example, various contents (e.g., a text, an image, a video, an icon, a symbol, and the like) to a user. The display 1560 may include a touch screen and may receive, for example, a touch, gesture, proximity, or hovering input using an electronic pen or a part of a user's body.

For example, the communication interface 1570 may establish communication between the electronic device 1501 and an external device (e.g., the first electronic device 1502, the second electronic device 1504, or the server 1506). For example, the communication interface 1570 may be connected to the network 1562 over wireless communication or wired communication to communicate with the external device (e.g., the second electronic device 1504 or the server 1506).

The wireless communication may use at least one of, for example, long-term evolution (LTE), LTE Advanced (LTE-A), Code Division Multiple Access (CDMA), Wideband CDMA (WCDMA), Universal Mobile Telecommunications System (UMTS), Wireless Broadband (WiBro), Global System for Mobile Communications (GSM), or the like, as cellular communication protocol. Furthermore, the wireless communication may include, for example, the local wireless communication 1564. The local wireless communication 1564 may include at least one of wireless fidelity (Wi-Fi), Bluetooth, near field communication (NFC), magnetic stripe transmission (MST), a global navigation satellite system (GNSS), or the like.

The MST may generate a pulse in response to transmission data using an electromagnetic signal, and the pulse may generate a magnetic field signal. The electronic device 1501 may transfer the magnetic field signal to point of sale (POS), and the POS may detect the magnetic field signal using a MST reader. The POS may recover the data by converting the detected magnetic field signal to an electrical signal.

The GNSS may include at least one of, for example, a global positioning system (GPS), a global navigation satellite system (Glonass), a Beidou navigation satellite system (hereinafter referred to as "Beidou"), or an European global satellite-based navigation system (hereinafter referred to as "Galileo") based on an available region, a bandwidth, or the like. Hereinafter, in this disclosure, "GPS" and "GNSS" may be interchangeably used. The wired communication may include at least one of, for example, a universal serial bus (USB), a high definition multimedia interface (HDMI), a recommended standard-232 (RS-232), a plain old telephone service (POTS), or the like. The network 1562 may include at least one of telecommunications networks, for example, a computer network (e.g., LAN or WAN), an Internet, or a telephone network.

Each of the first and second electronic devices 1502 and 1504 may be a device of which the type is different from or the same as that of the electronic device 1501. According to an embodiment, the server 1506 may include a group of one or more servers. According to various embodiments, all or a portion of operations that the electronic device 1501 will perform may be executed by another or plural electronic devices (e.g., the first electronic device 1502, the second electronic device 1504 or the server 1506). According to an embodiment, in the case where the electronic device 1501 executes any function or service automatically or in response to a request, the electronic device 1501 may not perform the function or the service internally, but, alternatively additionally, it may request at least a portion of a function associated with the electronic device 1501 at other electronic device (e.g., the electronic device 1502 or 1504 or the server 1506). The other electronic device may execute the requested function or additional function and may transmit the execution result to the electronic device 1501. The electronic device 1501 may provide the requested function or service using the received result or may additionally process the received result to provide the requested function or service. To this end, for example, cloud computing, distributed computing, or client-server computing may be used.

Figure 16:
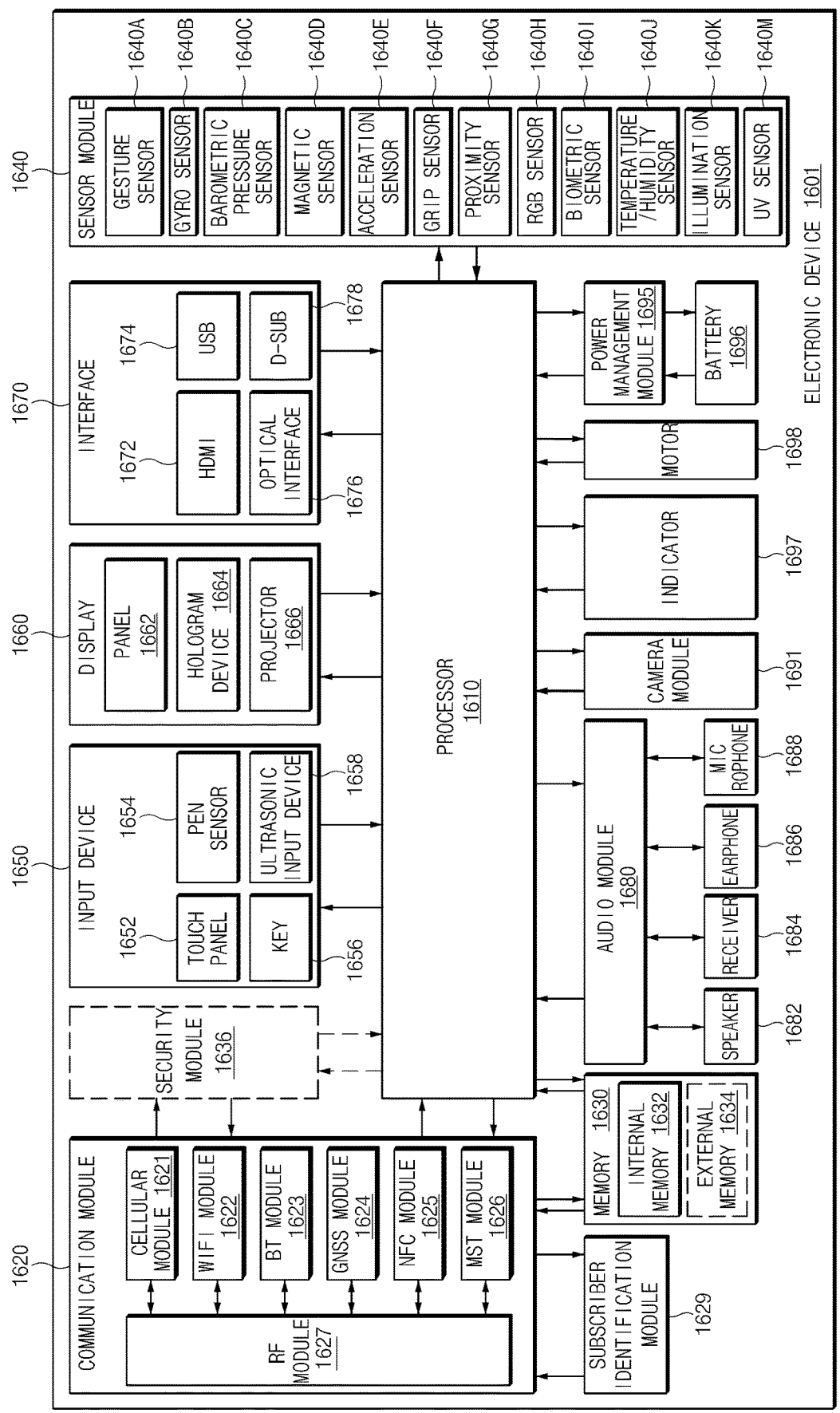
FIG. 16 is a block diagram of the electronic device according to various embodiments.

FIG. 16 illustrates a block diagram of an electronic device, according to various embodiments.

Referring to FIG. 16, an electronic device 1601 may include, for example, all or a part of the electronic device 1501 illustrated in FIG. 15. The electronic device 1601 may include one or more processors (e.g., an application processor (AP)) 1610, a communication module 1620, a subscriber identification module 1629, a memory 1630, a sensor module 1640, an input device 1650, a display 1660, an interface 1670, an audio module 1680, a camera module 1691, a power management module 1695, a battery 1696, an indicator 1697, and a motor 1698.

The processor 1610 may drive, for example, an operating system (OS) or an application to control a plurality of hardware or software elements connected to the processor 1610 and may process and compute a variety of data. For example, the processor 1610 may be implemented with a System on Chip (SoC). According to an embodiment, the processor 1610 may further include a graphic processing unit (GPU) and/or an image signal processor. The processor 1610 may include at least a part (e.g., a cellular module 1621) of elements illustrated in FIG. 16. The processor 1610 may load an instruction or data, which is received from at least one of other elements (e.g., a nonvolatile memory), into a volatile memory and process the loaded instruction or data. The processor 1610 may store a variety of data in the nonvolatile memory.

The communication module 1620 may be configured the same as or similar to the communication interface 1570 of FIG. 15. The communication module 1620 may include the cellular module 1621, a Wi-Fi module 1622, a Bluetooth (BT) module 1623, a GNSS module 1624 (e.g., a GPS module, a Glonass module, a Beidou module, or a Galileo module), a near field communication (NFC) module 1625, a MST module 1626 and a radio frequency (RF) module 1627.

The cellular module 1621 may provide, for example, voice communication, video communication, a character service, an Internet service, or the like over a communication network. According to an embodiment, the cellular module 1621 may perform discrimination and authentication of the electronic device 1601 within a communication network by using the subscriber identification module (e.g., a SIM card) 1629. According to an embodiment, the cellular module 1621 may perform at least a portion of functions that the processor 1610 provides. According to an embodiment, the cellular module 1621 may include a communication processor (CP).

Each of the Wi-Fi module 1622, the BT module 1623, the GNSS module 1624, the NFC module 1625, or the MST module 1626 may include a processor for processing data exchanged through a corresponding module, for example. According to an embodiment, at least a part (e.g., two or more) of the cellular module 1621, the Wi-Fi module 1622, the BT module 1623, the GNSS module 1624, the NFC module 1625, or the MST module 1626 may be included within one Integrated Circuit (IC) or an IC package.

For example, the RF module 1627 may transmit and receive a communication signal (e.g., an RF signal). For example, the RF module 1627 may include a transceiver, a power amplifier module (PAM), a frequency filter, a low noise amplifier (LNA), an antenna, or the like. According to another embodiment, at least one of the cellular module 1621, the Wi-Fi module 1622, the BT module 1623, the GNSS module 1624, the NFC module 1625, or the MST module 1626 may transmit and receive an RF signal through a separate RF module.

The subscriber identification module 1629 may include, for example, a card and/or embedded SIM that includes a subscriber identification module and may include unique identify information (e.g., integrated circuit card identifier (ICCID)) or subscriber information (e.g., international mobile subscriber identity (IMSI)).

The memory 1630 (e.g., the memory 1530) may include an internal memory 1632 or an external memory 1634. For example, the internal memory 1632 may include at least one of a volatile memory (e.g., a dynamic random access memory (DRAM), a static RAM (SRAM), a synchronous DRAM (SDRAM), or the like), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory), or the like), a hard drive, or a solid state drive (SSD).

The external memory 1634 may further include a flash drive such as compact flash (CF), secure digital (SD), micro secure digital (Micro-SD), mini secure digital (Mini-SD), extreme digital (xD), a multimedia card (MMC), a memory stick, or the like. The external memory 1634 may be operatively and/or physically connected to the electronic device 1601 through various interfaces.

A security module 1636 may be a module that includes a storage space of which a security level is higher than that of the memory 1630 and may be a circuit that guarantees safe data storage and a protected execution environment. The security module 1636 may be implemented with a separate circuit and may include a separate processor. For example, the security module 1636 may be in a smart chip or a secure digital (SD) card, which is removable, or may include an embedded secure element (eSE) embedded in a fixed chip of the electronic device 1601. Furthermore, the security module 1636 may operate based on an operating system (OS) that is different from the OS of the electronic device 1601. For example, the security module 1636 may operate based on java card open platform (JCOP) OS.

The sensor module 1640 may measure, for example, a physical quantity or may detect an operation state of the electronic device 1601. The sensor module 1640 may convert the measured or detected information to an electric signal. For example, the sensor module 1640 may include at least one of a gesture sensor 1640A, a gyro sensor 1640B, a barometric pressure sensor 1640C, a magnetic sensor 1640D, an acceleration sensor 1640E, a grip sensor 1640F, the proximity sensor 1640G, a color sensor 1640H (e.g., red, green, blue (RGB) sensor), a biometric sensor 1640I, a temperature/humidity sensor 1640J, an illuminance sensor 1640K, or an UV sensor 1640M. Although not illustrated, additionally or generally, the sensor module 1640 may further include, for example, an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 1640 may further include a control circuit for controlling at least one or more sensors included therein. According to an embodiment, the electronic device 1601 may further include a processor that is a part of the processor 1610 or independent of the processor 1610 and is configured to control the sensor module 1640. The processor may control the sensor module 1640 while the processor 1610 remains at a sleep state.

The input device 1650 may include, for example, a touch panel 1652, a (digital) pen sensor 1654, a key 1656, or an ultrasonic input unit 1658. For example, the touch panel 1652 may use at least one of capacitive, resistive, infrared and ultrasonic detecting methods. Also, the touch panel 1652 may further include a control circuit. The touch panel 1652 may further include a tactile layer to provide a tactile reaction to a user.

The (digital) pen sensor 1654 may be, for example, a part of a touch panel or may include an additional sheet for recognition. The key 1656 may include, for example, a physical button, an optical key, or a keypad. The ultrasonic input device 1658 may detect (or sense) an ultrasonic signal, which is generated from an input device, through a microphone (e.g., a microphone 1688) and may check data corresponding to the detected ultrasonic signal.

The display 1660 (e.g., the display 1560) may include a panel 1662, a hologram device 1664, or a projector 1666. The panel 1662 may be the same as or similar to the display 1560 illustrated in FIG. 15. The panel 1662 may be implemented, for example, to be flexible, transparent or wearable. The panel 1662 and the touch panel 1652 may be integrated into a single module. The hologram device 1664 may display a stereoscopic image in a space using a light interference phenomenon. The projector 1666 may project light onto a screen so as to display an image. For example, the screen may be arranged in the inside or the outside of the electronic device 1601. According to an embodiment, the display 1660 may further include a control circuit for controlling the panel 1662, the hologram device 1664, or the projector 1666.

The interface 1670 may include, for example, a high-definition multimedia interface (HDMI) 1672, a universal serial bus (USB) 1674, an optical interface 1676, or a D-subminiature (D-sub) 1678. The interface 1670 may be included, for example, in the communication interface 1570 illustrated in FIG. 15. Additionally or generally, the interface 1670 may include, for example, a mobile high definition link (MHL) interface, a SD card/multi-media card (MMC) interface, or an infrared data association (IrDA) standard interface.

The audio module 1680 may convert a sound and an electric signal in dual directions. At least a part of the audio module 1680 may be included, for example, in the input/output interface 1550 illustrated in FIG. 15. The audio module 1680 may process, for example, sound information that is input or output through a speaker 1682, a receiver 1684, an earphone 1686, or the microphone 1688.

For example, the camera module 1691 may shoot a still image or a video. According to an embodiment, the camera module 1691 may include at least one or more image sensors (e.g., a front sensor or a rear sensor), a lens, an image signal processor (ISP), or a flash (e.g., an LED or a xenon lamp).

The power management module 1695 may manage, for example, power of the electronic device 1601. According to an embodiment, a power management integrated circuit (PMIC), a charger IC, or a battery or fuel gauge may be included in the power management module 1695. The PMIC may have a wired charging method and/or a wireless charging method. The wireless charging method may include, for example, a magnetic resonance method, a magnetic induction method or an electromagnetic method and may further include an additional circuit, for example, a coil loop, a resonant circuit, a rectifier, or the like. The battery gauge may measure, for example, a remaining capacity of the battery 1696 and a voltage, current or temperature thereof while the battery is charged. The battery 1696 may include, for example, a rechargeable battery and/or a solar battery.

The indicator 1697 may display a specific state of the electronic device 1601 or a part thereof (e.g., the processor 1610), such as a booting state, a message state, a charging state, and the like. The motor 1698 may convert an electrical signal into a mechanical vibration and may generate the following effects: vibration, haptic, and the like. Although not illustrated, a processing device (e.g., a GPU) for supporting a mobile TV may be included in the electronic device 1601. The processing device for supporting the mobile TV may process media data according to the standards of digital multimedia broadcasting (DMB), digital video broadcasting (DVB), MediaFLO™, or the like.

Each of the above-mentioned elements of the electronic device according to various embodiments of the present disclosure may be configured with one or more components, and the names of the elements may be changed according to the type of the electronic device. In various embodiments, the electronic device may include at least one of the above-mentioned elements, and some elements may be omitted or other additional elements may be added. Furthermore, some of the elements of the electronic device according to various embodiments may be combined with each other so as to form one entity, so that the functions of the elements may be performed in the same manner as before the combination.

Figure 17:
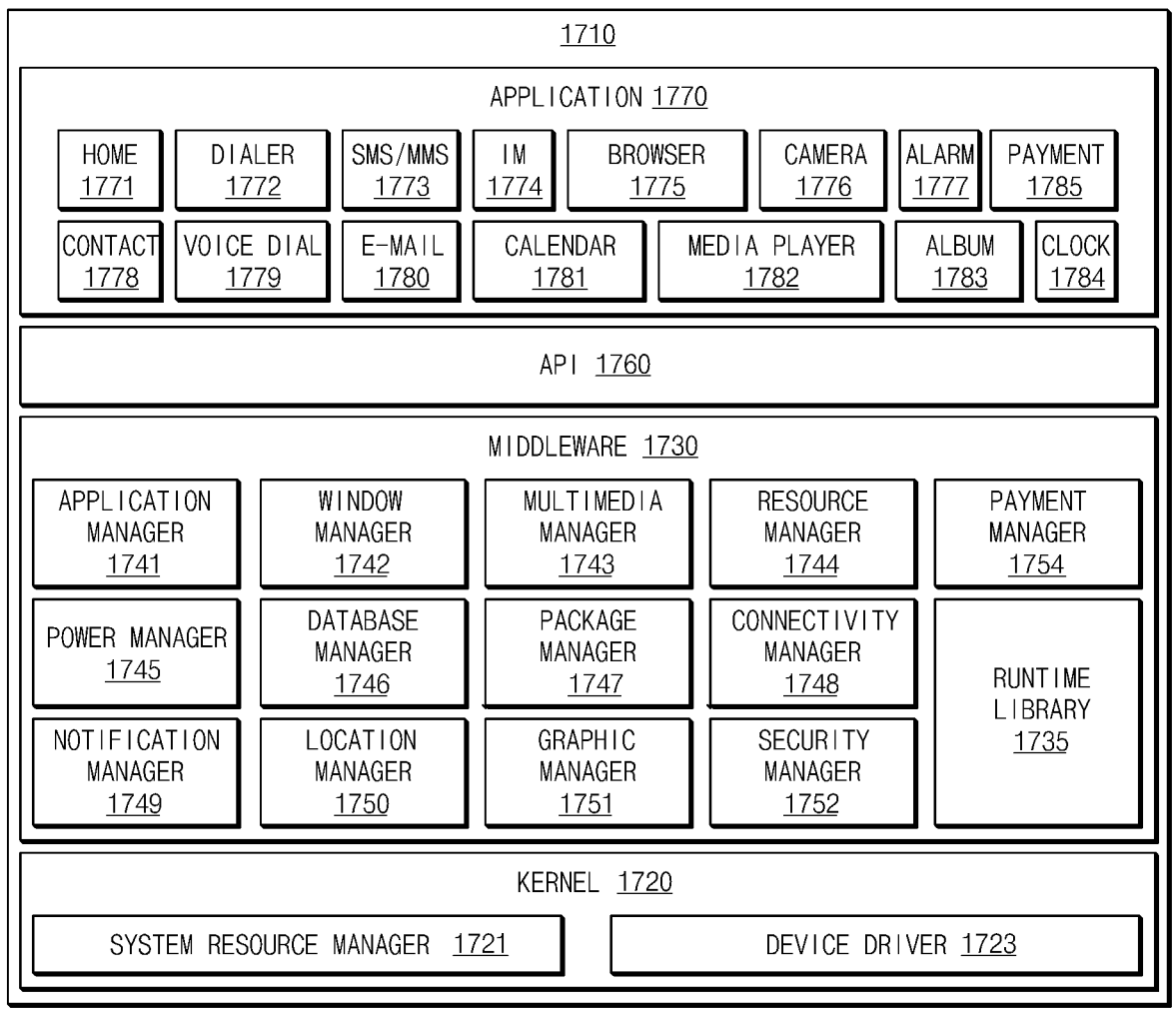
FIG. 17 is a block diagram of a program module according to various embodiments.

FIG. 17 illustrates a block diagram of a program module, according to various embodiments.

According to an embodiment, a program module 1710 (e.g., the program 1540) may include an operating system (OS) to control resources associated with an electronic device (e.g., the electronic device 1501), and/or diverse applications (e.g., the application program 1547) driven on the OS. The OS may be, for example, Android, iOS, Windows, Symbian, or Tizen.

The program module 1710 may include a kernel 1720, a middleware 1730, an application programming interface (API) 1760, and/or an application 1770. At least a portion of the program module 1710 may be preloaded on an electronic device or may be downloadable from an external electronic device (e.g., the first electronic device 1502, the second electronic device 1504, the server 1506, or the like).

The kernel 1720 (e.g., the kernel 1541) may include, for example, a system resource manager 1721 or a device driver 1723. The system resource manager 1721 may control, allocate, or retrieve system resources. According to an embodiment, the system resource manager 1721 may include a process managing unit, a memory managing unit, a file system managing unit, or the like. The device driver 1723 may include, for example, a display driver, a camera driver, a Bluetooth driver, a shared memory driver, a USB driver, a keypad driver, a Wi-Fi driver, an audio driver, or an inter-process communication (IPC) driver.

The middleware 1730 may provide, for example, a function that the application 1770 needs in common, or may provide diverse functions to the application 1770 through the API 1760 to allow the application 1770 to efficiently use limited system resources of the electronic device. According to an embodiment, the middleware 1730 (e.g., the middleware 1543) may include at least one of a runtime library 1735, an application manager 1741, a window manager 1742, a multimedia manager 1743, a resource manager 1744, a power manager 1745, a database manager 1746, a package manager 1747, a connectivity manager 1748, a notification manager 1749, a location manager 1750, a graphic manager 1751, a security manager 1752, or a payment manager 1754.

The runtime library 1735 may include, for example, a library module that is used by a compiler to add a new function through a programming language while the application 1770 is being executed. The runtime library 1735 may perform input/output management, memory management, or capacities about arithmetic functions.

The application manager 1741 may manage, for example, a life cycle of at least one application of the application 1770. The window manager 1742 may manage a graphic user interface (GUI) resource that is used in a screen. The multimedia manager 1743 may identify a format necessary for playing diverse media files, and may perform encoding or decoding of media files by using a codec suitable for the format. The resource manager 1744 may manage resources such as a storage space, memory, or source code of at least one application of the application 1770.

The power manager 1745 may operate, for example, with a basic input/output system (BIOS) to manage a battery or power, and may provide power information for an operation of an electronic device. The database manager 1746 may generate, search for, or modify database that is to be used in at least one application of the application 1770. The package manager 1747 may install or update an application that is distributed in the form of package file.

The connectivity manager 1748 may manage, for example, wireless connection such as Wi-Fi or Bluetooth. The notification manager 1749 may display or notify an event such as arrival message, appointment, or proximity notification in a mode that does not disturb a user. The location manager 1750 may manage location information about an electronic device. The graphic manager 1751 may manage a graphic effect that is provided to a user, or manage a user interface relevant thereto. The security manager 1752 may provide a general security function necessary for system security, user authentication, or the like. According to an embodiment, in the case where an electronic device (e.g., the electronic device 1501) includes a telephony function, the middleware 1730 may further include a telephony manager for managing a voice or video call function of the electronic device.

The middleware 1730 may include a middleware module that combines diverse functions of the above-described elements. The middleware 1730 may provide a module specialized to each OS kind to provide differentiated functions. Additionally, the middleware 1730 may dynamically remove a part of the preexisting elements or may add new elements thereto.

The API 1760 (e.g., the API 1545) may be, for example, a set of programming functions and may be provided with a configuration that is variable depending on an OS. For example, in the case where an OS is the android or the iOS, it may provide one API set per platform. In the case where an OS is the tizen, it may provide two or more API sets per platform.

The application 1770 (e.g., the application program 1547) may include, for example, one or more applications capable of providing functions for a home 1771, a dialer 1772, an SMS/MMS 1773, an instant message (IM) 1774, a browser 1775, a camera 1776, an alarm 1777, a contact 1778, a voice dial 1779, an e-mail 1780, a calendar 1781, a media player 1782, an album 1783, a timepiece 1784, a payment 1785, health care (e.g., measuring an exercise quantity, blood sugar, or the like), or offering of environment information (e.g., information of barometric pressure, humidity, temperature, or the like).

According to an embodiment, the application 1770 may include an application (hereinafter referred to as "information exchanging application" for descriptive convenience) to support information exchange between an electronic device (e.g., the electronic device 1501) and an external electronic device (e.g., the first electronic device 1502 or the second electronic device 1504). The information exchanging application may include, for example, a notification relay application for transmitting specific information to an external electronic device, or a device management application for managing the external electronic device.

For example, the notification relay application may include a function of transmitting notification information, which arise from other applications (e.g., applications for SMS/MMS, e-mail, health care, or environmental information), to an external electronic device. Additionally, the notification relay application may receive, for example, notification information from an external electronic device and provide the notification information to a user.

The device management application may manage (e.g., install, delete, or update), for example, at least one function (e.g., turn-on/turn-off of an external electronic device itself (or a part of components) or adjustment of brightness (or resolution) of a display) of the external electronic device which communicates with the electronic device, an application running in the external electronic device, or a service (e.g., a call service, a message service, or the like) provided from the external electronic device.

According to an embodiment, the application 1770 may include an application (e.g., a health care application of a mobile medical device) that is assigned in accordance with an attribute of an external electronic device. According to an embodiment, the application 1770 may include an application that is received from an external electronic device (e.g., the first electronic device 1502, the second electronic device 1504, or the server 1506). According to an embodiment, the application 1770 may include a preloaded application or a third party application that is downloadable from a server. The names of elements of the program module 1710 according to the embodiment may be modifiable depending on kinds of operating systems.

According to various embodiments, at least a portion of the program module 1710 may be implemented by software, firmware, hardware, or a combination of two or more thereof. At least a portion of the program module 1710 may be implemented (e.g., executed), for example, by the processor (e.g., the processor 1610). At least a portion of the program module 1710 may include, for example, modules, programs, routines, sets of instructions, processes, or the like for performing one or more functions.

The term "module" used in this disclosure may represent, for example, a unit including one or more combinations of hardware, software and firmware. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in computer-readable storage media in the form of a program module. The instruction, when executed by a processor (e.g., the processor 1520), may cause the one or more processors to perform a function corresponding to the instruction. The computer-readable storage media, for example, may be the memory 1530.

A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and hardware devices (e.g., a read only memory (ROM), a random access memory (RAM), or a flash memory). Also, a program instruction may include not only a mechanical code such as things generated by a compiler but also a high-level language code executable on a computer using an interpreter. The above hardware unit may be configured to operate via one or more software modules for performing an operation of various embodiments of the present disclosure, and vice versa.

A module or a program module according to various embodiments may include at least one of the above elements, or a part of the above elements may be omitted, or additional other elements may be further included. Operations performed by a module, a program module, or other elements according to various embodiments may be executed sequentially, in parallel, repeatedly, or in a heuristic method. In addition, some operations may be executed in different sequences or may be omitted. Alternatively, other operations may be added.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
 a sensor configured to sense whether the electronic device is gripped by a user;
 a display; and
 a processor electrically connected with the sensor and the display,
 wherein, if it is sensed that the electronic device is gripped by the user, the processor is configured to:
  display a preset user interface (UI) including at least one of a home key, a back key, a multi-key, or a menu key, at a lower end of the display; and
  after displaying the preset UI, if it is not sensed that the electronic device is gripped by the user, the processor is configured to stop displaying the preset UI.

2. The electronic device of claim 1, wherein the sensor includes:
 a first pattern circuit for sensing whether the electronic device is gripped by the user; and
 a second pattern circuit for sensing whether the user's hand is close to the specific area of the electronic device.

3. The electronic device of claim 2, wherein the second pattern circuit is positioned at a lower end of the electronic device.

4. The electronic device of claim 1, wherein the display includes:
 a touch screen panel configured to a hovering input, and wherein the processor determines whether the user's hand is close to the specific area, based on the hovering input.

5. The electronic device of claim 1, further comprising:
an antenna including a third pattern circuit,
wherein the sensor senses whether the user's hand is close to the specific area of the electronic device, by using the third pattern circuit.

6. The electronic device of claim 1, wherein the sensor senses at least one of whether the electronic device is gripped by a user or whether the user's hand is close to the specific area of the electronic device, based on a change in an electromagnetic field.

7. The electronic device of claim 1, further comprising:
an input module comprising input circuitry,
wherein, the processor is configured to perform an operation corresponding to an input that the input module receives if it is sensed that the hand is within a predetermined proximity to the input module and the input module receives an input.

8. The electronic device of claim 7, wherein the input module is an inductive key that obtains an input based on an inductance change according to a press.

9. The electronic device of claim 8, wherein the inductive key includes a sensor coil for obtaining an input from the user, and
wherein the sensor senses whether the user's hand is close to the input module, by using the sensor coil.

10. The electronic device of claim 9, wherein the sensor coil is connected with a circuit of the inductive key and a circuit of the sensor through a switch circuit,
wherein, if the switch circuit connects the sensor coil and the circuit of the inductive key and the inductive key obtains the input, the processor control the switch circuit to connect the sensor coil and the circuit of the sensor.

11. The electronic device of claim 9, wherein the sensor coil is connected with a circuit of the inductive key and a circuit of the sensor through a switch circuit,
wherein, if the switch circuit connects the sensor coil and the circuit of the sensor and that the user's hand is close to the input module is sensed by the sensor, the processor control the switch circuit to connect the sensor coil and the circuit of the inductive key.

12. The electronic device of claim 7, wherein the input module is positioned on a side surface of the electronic device.

13. The electronic device of claim 12, wherein the operation corresponding to the input is a volume control of sound that the electronic device outputs.

14. The electronic device of claim 7, wherein, if that the user's hand is close to the input module is sensed, the processor displays an UI associated with the operation corresponding to the input.

15. The electronic device of claim 14, wherein the UI includes a volume level of sound that the electronic device outputs.

16. The electronic device of claim 1, further comprising:
a coupling detection sensor configured to sense whether an external device is coupled to the electronic device,
wherein the processor is configured to cause the electronic device to display a screen on the display in a first mode if the external device is not coupled to the electronic device and the electronic device is not gripped, and to cause the electronic device to display a screen on the display in a second mode that is determined based on whether the external device is coupled to the electronic device and the electronic device is gripped.

17. The electronic device of claim 16, wherein the screen mode is determined as a second mode being a mode where the screen of the first mode is turned 180 degrees, if the external device is coupled and the electronic device is not gripped.

18. The electronic device of claim 16, wherein the screen mode is determined as the first mode, if the external device is coupled and the electronic device is gripped.

* * * * *